(12) United States Patent
Kikugawa

(10) Patent No.: US 6,285,260 B1
(45) Date of Patent: Sep. 4, 2001

(54) PHASE-LOCKED LOOP HAVING CIRCUIT FOR SYNCHRONIZING STARTING POINTS OF TWO COUNTERS

(75) Inventor: Hirohisa Kikugawa, Tokyo (JP)

(73) Assignee: Seiko Precision, Inc., Chiba-ken (JP)

(*) Notice: Subject to any disclaimer, the term of this patent is extended or adjusted under 35 U.S.C. 154(b) by 0 days.

(21) Appl. No.: 09/471,711

(22) Filed: Dec. 23, 1999

(30) Foreign Application Priority Data

Dec. 25, 1998 (JP) .................................................. 10-369094

(51) Int. Cl.$^7$ ............................... H03L 7/089; H03L 7/18
(52) U.S. Cl. ............................... 331/1 A; 331/17; 331/25; 331/14
(58) Field of Search ............................... 331/1 A, 17, 25, 331/14

(56) References Cited

U.S. PATENT DOCUMENTS 5,461,344 * 10/1995 Andoh ..................................... 331/25
6,150,891 * 11/2000 Welland et al. ........................ 331/25

* cited by examiner

Primary Examiner—Siegfried H. Grimm
(74) Attorney, Agent, or Firm—Schulte, Roth & Zabel

(57) ABSTRACT

A phase-locked loop (PLL) circuit having a shortened locking time. A first counter divides down the output from a reference signal source and produces output signal FR. A second counter divides down the output from a voltage-controlled oscillator (VCO) circuit and produces a second output signal FV. When the phase of the second output signal FV is lagging the phase of the first output signal FR, a control circuit resets the first counter. When the phase of the second output signal is leading the phase of the first output signal, the control circuit resets the second counter. As a result, the starting points of counting operations performed by the first and second counters are synchronized. This brings the phase difference detected by the phase comparator circuit into coincidence with the actual phase difference between the first and second output signals FR, FV. Thus, the phase difference is appropriately fed as a control voltage back to the VCO circuit thereby shortening the locking time.

2 Claims, 3 Drawing Sheets

PHASE-LOCKED LOOP HAVING CIRCUIT FOR SYNCHRONIZING STARTING POINTS OF TWO COUNTERS

BACKGROUND OF THE INVENTION

1. Field of the Invention

The present invention relates to a phase-locked loop (PLL) circuit.

2. Description of the Prior Art

A PLL frequency synthesizer, known as a PLL circuit, which is currently available in mobile communications and other applications is shown in FIG. 4. A counter 42 divides a frequency of an output signal of a reference signal source 41 to produce an output signal indicative of a divided frequency signal of the reference signal source 41. Another counter 44 divides a frequency of an output signal of a voltage-controlled oscillator (VCO) circuit 43 to produce an output signal indicative of a divided frequency signal of the output signal from the voltage-controlled oscillator (VCO) circuit 43. A phase comparator circuit 45 compares these two output signals and produces output signals from its terminals UP and DN, respectively. These output signals have pulse widths corresponding to the amount of lag or lead of the phase of the output signal FV from the counter 44 with respect to the output signal FR from the counter 42. A charge pump 46 charges or discharges capacitive elements (not shown) in response to the output signals appearing at the terminals UP and DN. The charging current from the charge pump 46 is smoothed out by a low-pass filter 47. The output voltage signal from the filter 47 is supplied as a control voltage to the voltage-controlled oscillator circuit 43. Shifts of the phases of the output signals FR and FV introduced at a startup or when a channel is switched are fed as the control voltage back to the voltage-controlled oscillator circuit 43. As a result, the frequencies of the output signals FR and FV become coincident. That is, the PLL circuit locks up.

In the circuit shown in FIG. 4, the counters 42 and 44 do not start to count simultaneously. Therefore, the phase difference detected by the phase comparator circuit 45 does not agree with the actual phase difference between the output signals FR and FV. For example, it is assumed that the output signals FR and FV have periods of fR and fV1, respectively, in the initial state as illustrated in the timing chart of FIG. 5, and that the phase difference delivered from the phase comparator circuit 45 is α1. If the output signal FV subsequently assumes a period of fV2, a phase difference α2 delivered from the phase comparator circuit 45 at the next phase comparison timing is given by $$\alpha 2 = (fR - \alpha 1) - fV2$$

On the other hand, the actual phase difference α3 between the output signals FR and FV is given by $$\alpha 3 = fR - fV2$$

In this way, the phase difference α2 produced from the phase comparator circuit 45 is not coincident with the actual phase difference α3. Consequently, appropriate feedback control on the control voltage is not provided. This has prolonged the locking time.

SUMMARY OF THE INVENTION

It is an object of the present invention to provide a phase-locked loop circuit free of the foregoing problems.

In the present invention, a phase comparator circuit compares a first output signal from a first counter and a second output signal from a second counter in terms of phase. The first counter divides down the output frequency of a reference signal source. The second counter divides down the output frequency of a voltage-controlled oscillator (VCO) circuit. If the second output signal lags the first output signal in phase, the phase comparator circuit produces a first error signal having a pulse width corresponding to the lag of the phase. If the second output signal leads the first output signal in phase, the phase comparator circuit produces a second error signal having a pulse width corresponding to the lead of the phase. Either the first or second error signal is supplied as a control voltage to the VCO circuit via a charge pump circuit and via a low-pass filter circuit. During the interval in which the phase lags, the first counter is reset. During the interval in which the phase leads, the second counter is reset.

This synchronizes the starting points of the counting operations of the first and second counters. The phase difference detected by the phase comparator circuit is brought into coincidence with the actual phase difference between the first and second output signals. Hence, the locking time can be shortened.

Accordingly, the present invention provides a phase-locked loop circuit comprising: a reference signal source for producing an output signal of a reference frequency; a first counter for dividing down the reference frequency of the output signal from the reference signal source and producing a first output signal; a voltage-controlled oscillator circuit for producing an output signal having a frequency corresponding to a control voltage; a second counter for dividing down the output signal from said voltage-controlled oscillator circuit and producing a second output signal; a phase comparator circuit for comparing the first and second output signals from said first and second counters in phase, respectively, and producing a first error signal or a second error signal; a charge pump circuit driven by said first or second error signal from said phase comparator circuit; a low-pass filter for converting the output from said charge pump circuit into said control voltage and supplying it to said voltage-controlled oscillator circuit; and a control circuit. When the second output signal is lagging the first output signal in phase, the phase comparator circuit produces said first error signal having a pulse width corresponding to the lag of the phase. When the second output signal leads the first output signal, the phase comparator circuit produces said second error signal having a pulse width corresponding to the lead of the phase. When the phase is lagging, the control circuit resets the first counter. When the phase is leading, the control circuit resets the second counter.

Preferably, the control circuit resets the first or second counter, depending on whether the phase is lagging or leading, respectively, in response to the first or second error signal, respectively.

Other objects and features of the invention will appear in the course of the description thereof, which follows.

DESCRIPTION OF THE PREFERRED EMBODIMENTS

Figure 1:
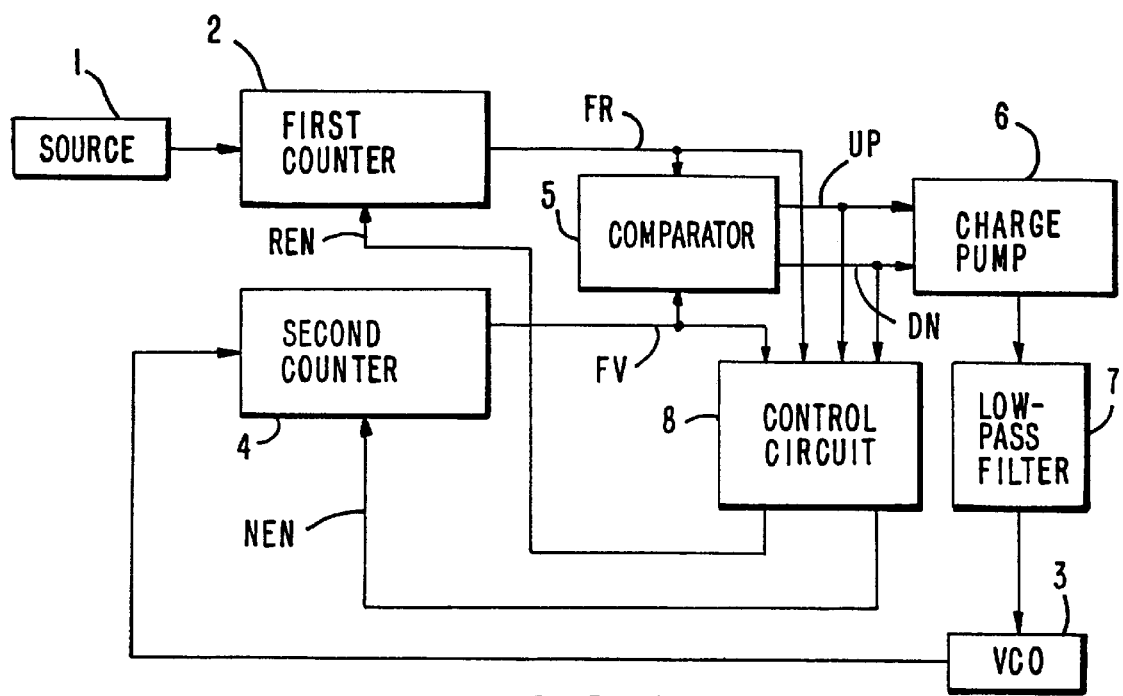
FIG. 1 is a block diagram of a phase-locked loop (PLL) circuit in accordance with one embodiment of the present invention.

A phase-locked loop (PLL) circuit in accordance with one embodiment of the present invention is next described by referring to FIG. 1. A reference signal source 1 produces a signal having a reference frequency. A first counter 2 divides down the reference frequency signal by an appropriate divide ratio to produce a first output signal FR. A voltage-controlled oscillator (VCO) circuit 3 produces a frequency signal, which is divided down by a second counter 4 by an appropriate divide ratio to produce a second output signal FV. The first and second counters 2 and 4, respectively, are programmable counters whose frequency divide ratios are controlled by a control portion (not shown) to switch the channel. A phase comparator circuit 5 compares the first and second output signals FR, FV in terms of phase. If the second output signal FV lags the first output signal FR in phase, the phase comparator circuit 5 produces a first error signal UP having a pulse width corresponding to the phase lag. If the second output signal FV leads the first output signal FR in phase, the phase comparator circuit 5 produces a second error signal DN having a pulse width corresponding to the phase lead. A charge pump 6 is driven by either the first error signal UP or the second error signal DN. A low-pass filter circuit 7 converts the output from the charge pump circuit 6 into a control voltage and sends it to the VCO circuit 3. A control circuit 8 resets the first counter 2 while the aforementioned phase is lagging and resets the second counter 4 while the phase is leading.

Figure 2:
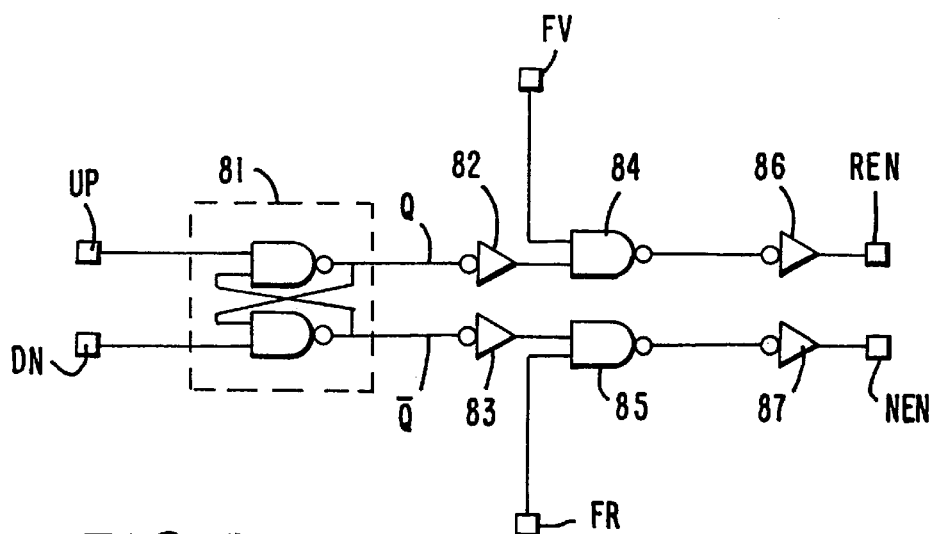
FIG. 2 is a circuit diagram of main portions of the circuit shown in FIG. 1.

It is only necessary for the control circuit 8 to control the first counter 2 and the second counter 4. In particular, a circuit as shown in FIG. 2 is used. A flip-flop 81 receives the first error signal UP and the second error signal DN and sets and resets its output terminals Q and $\overline{Q}$ respectively. These outputs are inverted by inverters 82 and 83, respectively, and each applied to a respective one of input terminals of NAND gates 84 and 85. The second output signal FV and the first output signal FR are supplied to the other input terminals of the NAND gates 84 and 85, respectively. The outputs from the NAND gates 84 and 85 are inverted by inverters 86 and 87, respectively, and fed to reset terminals REN and NEN of the first counter 2 and the second counter 4, respectively.

Figure 3:
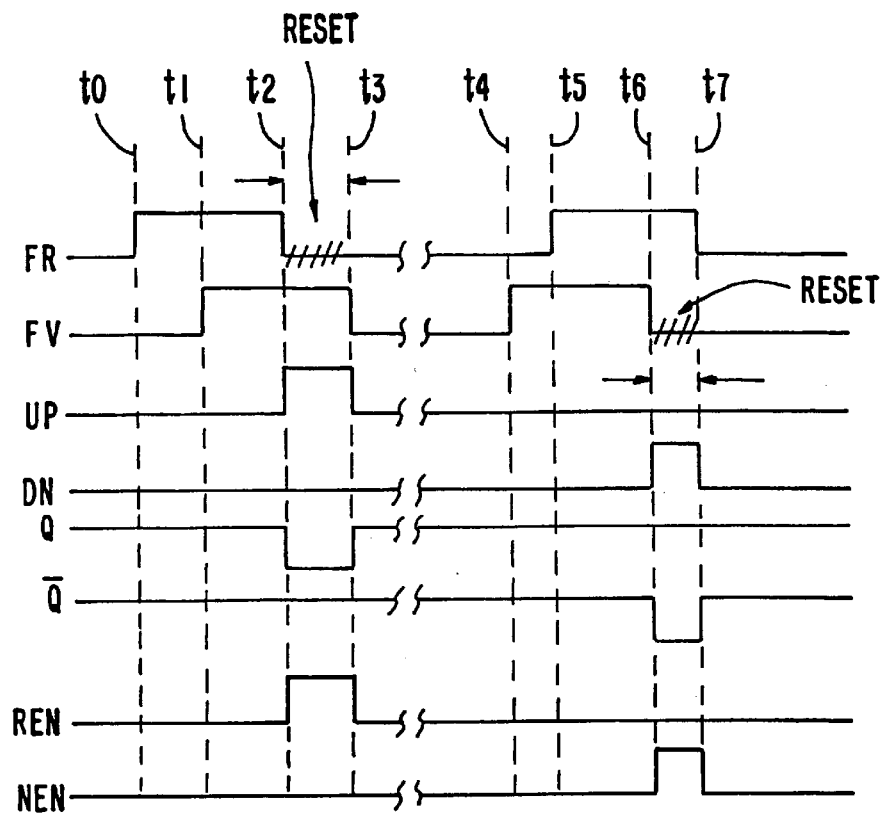
FIG. 3 is a timing chart illustrating the operation of the circuit shown in FIG. 1.
Figure 4:
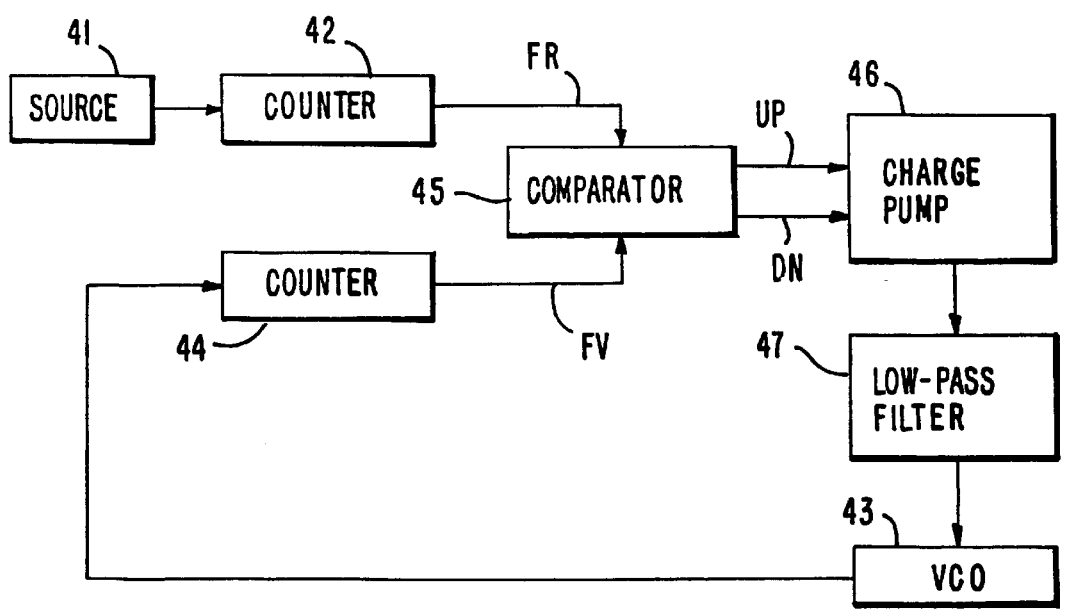
FIG. 4 is a block diagram of the prior PLL circuit.
Figure 5:
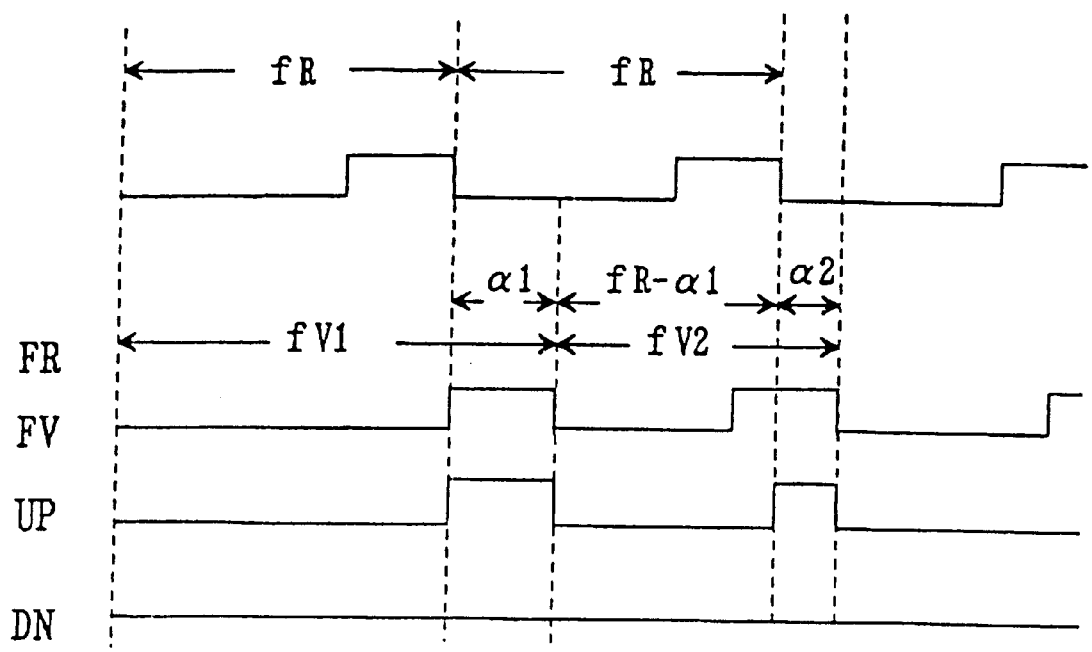
FIG. 5 is a timing chart illustrating the operation of the circuit shown in FIG. 4.

The operation of the circuit constructed as described thus far is next described by referring to the timing chart of FIG. 3. It is first assumed that the second output signal FV lags the first output signal FR. The first output signal FR has a rising edge at instant t0. The second output signal FV has a rising edge at instant t1. In the control circuit 8, the first and second error signals UP and DN, respectively, applied to the flip-flop 81 are in low (L) state and thus the NAND gates 84 and 85 are generally disabled. Under this disabled condition, the signals appearing at the terminals Q and $\overline{Q}$ can be regarded as being in a sufficiently high (H) state from the inputs of the inverters 82 and 83.

If the first output signal FR has a falling edge at instant t2, the first error signal UP from the terminal UP of the phase comparator circuit 5 shows a rising edge. In response to this, the signal Q shows a falling edge in the control circuit 8. This signal Q is applied to one input terminal of the NAND gate 84 via the inverter 82. Since the signal FV applied to the other input terminal is in a high (H) state, the output from the NAND gate 84 is in a low (L) state. The output from the NAND gate 84 is supplied to the reset terminal REN of the first counter 2 via the inverter 86. That is, the signal REN rises in response to the falling edge of the signal Q, thus resetting the first counter 2. While the first counter 2 is in its reset condition, the first output signal FR is maintained in L state and so the phase comparator circuit 5 in the following stage is not affected.

If the second output signal FV falls at instant t3, the first error signal UP falls. This causes the signal Q to rise and the signal REN to drop. The reset state of the first counter 2 is canceled and the counting operation of the first counter 2 is resumed. At the same time, the second counter 4 starts to count the next pulse period of the signal FV. Consequently, the starting points of the counting operations of the first and second counters 2, 4 are synchronized. In the prior art, when the second counter 4 begins to count the period of the next pulse, the first counter 2 has already counted the period of the next pulse. Unlike this prior art technique, the phase difference detected by the phase comparator circuit 5 can be brought into coincidence with the actual phase difference between the first output signal FR and the second output signal FV. In consequence, the phase difference is appropriately fed as a control voltage back to the VCO circuit 3. The locking time can be shortened.

It is now assumed that the second output signal FV is leading the first output signal FR. If the second output signal FV shows a rising edge at instant t4, and if the first output signal FR shows a rising edge at instant t5, the two inputs to the flip-flop 81 are both in L state in the control circuit 8. The signals at the terminals Q and $\overline{Q}$ are supplied as H-state signals to the inverters 82 and 83, respectively.

If the second output signal FV drops at instant t6, the second error signal DN from the terminal DN of the phase comparator circuit 5 rises. In response to this, the signal Q drops in the control circuit 8. This signal $\overline{Q}$ is applied to one input of the NAND gate 85 via the inverter 83. Since the first output signal FR applied to the other input terminal is in high (H) state, the output from the NAND gate 85 goes low (L) state. The output from the NAND gate 85 is supplied to the reset terminal NEN of the second counter 4 via the inverter 87. That is, the signal NEN rises in response to the falling edge of the signal thus resetting the second counter 4.

If the first output signal FR drops at the next instant t7, the second error signal DN drops. The signal $\overline{Q}$ rises, while the signal NEN drops. The reset condition of the second counter 4 is canceled and the counting operation of the second counter 4 is resumed. Concurrently, the first counter 2 starts to count the period of the next pulse of the signal FR. In this way, if the second output signal FV is leading the first output signal FR, the starting points of the counting operations of the first and second counters 2, 4 are synchronized for phase comparison of the next pulses of the first and second output signals FR, FV.

As described thus far, in the present embodiment, the control circuit 8 resets the first counter 2 while the phase of the second output signal FV is lagging the first output signal FR, and resets the second counter 4 while the phase is leading. Therefore, the starting points of the counting operations of the first and second counters 2, 4 are synchronized. The phase difference detected by the phase comparator circuit 5 can be brought into coincidence with the actual phase difference between the first output signal FR and the second output signal FV. Hence, the phase difference is appropriately fed as a control voltage back to the VCO circuit 3. As a consequence, the locking time can be decreased.

In a phase-locked loop circuit in accordance with the present invention, a phase comparator circuit compares a first output signal from a first counter and a second output signal from a second counter in terms of phase. The first counter divides down the output from a reference signal source. The second counter divides down the output from a voltage-controlled oscillator (VCO) circuit. If the phase of the second output signal lags the phase of the first output signal, the phase comparator circuit produces a first error signal having a pulse width corresponding to the phase delay. If the phase of the second output signal leads the phase of the first output signal, the phase comparator circuit produces a second error signal having a pulse width corresponding to the phase lead. The first or second error signal is fed as a control voltage back to the VCO circuit via a charge pump circuit and via a low-pass filter circuit. The PLL circuit includes a control circuit for resetting the first counter or the second counter, depending on whether the phase is lagging or leading, respectively. Therefore, the starting points of counting performed by the first and second counters can be synchronized. The phase difference detected by the phase comparator circuit can be brought in to coincidence with the actual phase difference between the first and second output signals. Consequently, the first and second error signals, or the phase difference, are appropriately fed as a control voltage to the VCO circuit. Hence, the locking time can be shortened.

What is claimed is:

1. A phase-locked loop circuit comprising:
   a source for producing a reference-frequency signal;
   a first counter for dividing down said reference-frequency signal and producing a first output signal;
   a voltage-controlled oscillator (VCO) circuit for producing a VCO output signal;
   a second counter for dividing down said VCO output signal and producing a second output signal;
   a phase comparator circuit for comparing the phase of said first and second output signals, said phase comparator circuit producing a first error signal when the phase of said second output signal lags the phase of said first output signal, said first error signal having a pulse width corresponding to the lag in phase,
   said phase comparator circuit producing a second error signal when the phase of said second output signal leads the phase of said first output signal, said second error signal having a pulse width corresponding to the lead in phase;
   a charge pump circuit driven by said first and second error signals;
   a low-pass filter for converting an output from said charge pump circuit into a control voltage applied to said VCO circuit; and
   a control circuit for resetting said first counter when said phase of said second output signal lags the phase of said first output signal and for resetting said second counter when said phase of said second output signal leads the phase of said first output signal.

2. The phase-locked loop circuit as set forth in claim 1, wherein said control circuit resets said first counter or said second counter in response to said first error signal or said second error signal, respectively.

* * * * *

UNITED STATES PATENT AND TRADEMARK OFFICE
CERTIFICATE OF CORRECTION

PATENT NO. : 6,285,260 B1 Page 1 of 1
DATED : September 4, 2001
INVENTOR(S) : Hirohisa Kikugawa It is certified that error appears in the above-identified patent and that said Letters Patent is hereby corrected as shown below:

<u>Title page,</u>
Item [73], Assignee should be changed from "Seiko Precision, Inc. to -- Nippon Precision Circuits, Inc., Chuo-ku, Tokyo, Japan --

Signed and Sealed this

Eighth Day of October, 2002

*Attest:*

JAMES E. ROGAN
*Attesting Officer*  *Director of the United States Patent and Trademark Office*